United States Patent
Bila et al.

(10) Patent No.: US 9,391,585 B2
(45) Date of Patent: Jul. 12, 2016

(54) COMPACT MULTI-PORT ROUTER DEVICE

(71) Applicants: Centre National D'Etudes Spatiales, Paris (FR); Centre National De La Recherche Scientifique (C.N.R.S.), Paris (FR); Inria Institut National De Recherche En Informatique Et En Automatique, Le Chesnay (FR); Thales, Neuilly Sur Seine (FR)

(72) Inventors: Stéphane Bila, Limoges (FR); Lëtitia Estagerie, Toulouse (FR); Damien Pacaud, Toulouse (FR); Jérôme Puech, Toulouse (FR); Fabien Seyfert, Sophia-Antipolis (FR); Serge Verdeyme, Limoges (FR); Hussein Ezzeddine, Limoges (FR); Pierre Mazet, Limoges (FR)

(73) Assignees: Centre National D'Etudes Spatiales, Paris (FR); Centre National De La Recherche Scientifique (C.N.R.S.), Paris (FR); Inria Institut National De Recherche En Informatique Et En Automatique, Le Chesnay (FR); Thales, Neuilly sur Seine (FR)

( * ) Notice: Subject to any disclaimer, the term of this patent is extended or adjusted under 35 U.S.C. 154(b) by 200 days.

(21) Appl. No.: 14/041,755

(22) Filed: Sep. 30, 2013

(65) Prior Publication Data

US 2014/0091878 A1    Apr. 3, 2014

(30) Foreign Application Priority Data

Oct. 1, 2012   (FR) ..................................... 12 59276

(51) Int. Cl.
*H01P 5/12*    (2006.01)
*H03H 7/46*    (2006.01)
*H01P 1/208*   (2006.01)
*H01P 1/213*   (2006.01)

(52) U.S. Cl.
CPC .............. *H03H 7/46* (2013.01); *H01P 1/2086* (2013.01); *H01P 1/2133* (2013.01); *H01P 5/12* (2013.01)

(58) Field of Classification Search
CPC ........... H03H 7/46; H01P 5/12; H01P 1/2133; H01P 1/2086
USPC ........................................................ 333/134
See application file for complete search history.

(56) References Cited

U.S. PATENT DOCUMENTS 6,624,723 B2 *   9/2003   Wang ............................ 333/134
2010/0134202 A1 *  6/2010   Leinonen et al. ............. 333/132

FOREIGN PATENT DOCUMENTS

| EP | 0096461 A2 | 12/1983 |
| EP | 0987786 A2 | 3/2000 |
| EP | 0987786 A3 | 10/2001 |

OTHER PUBLICATIONS

Search Report dated on Jul. 26, 2013, issued in connection with French Patent Appln. No. 1259276 (4 pages).

(Continued)

*Primary Examiner* — Robert Pascal
*Assistant Examiner* — Kimberly Glenn
(74) *Attorney, Agent, or Firm* — McCarter & English, LLP

(57) ABSTRACT

The invention relates to a multi port router device capable of carrying a number P, which is greater than or equal to three, of frequency channels, from a number M of input ports to a number N of output ports, at least one of the two numbers M and N being greater than or equal to two, characterized in that it includes at least two filters (12, 14, 16, 18), each filter comprising at least two coupled resonators, at least one resonator (Rs1, Rs2) being common to two different filters, and each input port and each output port being connected directly to at least one resonator. The router device is capable of appropriately performing routing in which it is possible to supply on at least one output port an output multiplex having at least a first and a second frequency channel, among which: the first frequency channel has originated from a first input multiplex, supplied on a first input port and comprising said first frequency channel, and at least one further frequency channel forwarded to a second output port of the device; and the second frequency channel is either forwarded from a second input port, or, when the first input multiplex comprises at least three different multiplexed frequency channels, the second frequency channel originates from the first input multiplex, the first second frequency channels, being frequentially disposed on both sides of a third frequency channel, with the said third frequency channel being routed to a different output port.

9 Claims, 8 Drawing Sheets

(56) References Cited

OTHER PUBLICATIONS

Garcia-Lamperez, et al., "Analytical Synthesis of Microwave Multiport Networks," IEEE MTT-S International Microwave Symposium Digest, (2004) (4 pages).

Ezzeddine, et al., "Coupling Topologies for Realizing Compact Microwave Diplexers with Dual-Mode Cavities," IEEE MTT-S International Microwave Symposium Digest, (2010) (4 pages).

Bila, et al., "Advanced Design of Microwave Filters and Multiplexers," Proceedings of the Asia-Pacific Microwave Conference (APMC) (2011) (3 pages).

* cited by examiner

COMPACT MULTI-PORT ROUTER DEVICE

RELATED APPLICATIONS

This application claims the benefit of French Patent Application No. 12 59276 filed on Oct. 1, 2012. The entire disclosure of this application is incorporated herein by reference.

FIELD OF THE INVENTION

The present invention relates to a multi port router device capable of carrying a number P, which is greater than or equal to three, of frequency channels, from a number M of input ports to a number N of output ports.

The invention pertains to the domain of hyperfrequency and microwave communications, and finds particular application in the field of telecommunication satellites.

BACKGROUND OF THE INVENTION

The state of the art includes various known technologies including various architectures for devices that are capable of performing hyperfrequency communications functions, in particular functions such as filtering, multiplexing and routing of hyperfrequency microwave signals transmitted by frequency channels each one thereof having an associated hyperfrequency carrier.

The function of filtering frequency channels consists of filtering one or more carriers in a predetermined frequency channel, thereby enabling the separation of several frequency channels.

The input multiplexing function consists of either separating a stream of carriers or frequency multiplexes composed of P number of different input frequency channels, received on one single input port of a multiplexing device, into P output frequency channels, with each sent on a different port. In a dual manner, the output multiplexing function consists of combining P frequency channels received on M number of input ports into one output multiplex consisting of P frequency channels forwarded on to an output port.

The routing function consists of separating P number of frequency channels received on M input ports towards N number of output ports, by recombining the frequency channels of the input multiplexes into the output multiplexes. More specifically, the input routing function, hereinafter to be referred to as shared output routing, consists of separating at least one first channel of a first input multiplex supplied on a first input port and then of directing it towards a first output multiplex of a first output port, the first output multiplex also comprising a second channel originating from a second input multiplex supplied on a second input port. The so called shared input output routing is defined in a dual manner.

As it may be noted, the routing functions, respectively shared output input routing or shared input output routing, differ from multiplexing because they involve a separation and a recombination of the frequency channels between input and output. The implementation of the routing functions is therefore much more complex than the implementation of the multiplexing functions.

It is a known practice to develop a router device by combining diplexers or by combining resonator filters, with the connections being made with the use of elements for division and passive combination, such as waveguides, "T" junctions, dividers, circulators and isolators. Such a router device is cumbersome having a large mass and space requirement, as well as resulting in additional insertion loss.

It is thus desirable to develop multiport router devices that are capable of performing the functions of filtering as well as of shared output input routing and/or shared input output routing, which are more compact and more efficient than currently known devices.

SUMMARY OF THE INVENTION

To this end, the invention provides a multi port router device that is capable of carrying a number P, which is greater than or equal to three, of frequency channels, from a number M of input ports to a number N of output ports, at least one of the two numbers M and N being greater than or equal to two. The router is characterised in that it includes at least two filters, each filter comprising at least two coupled resonators, with at least one resonator being common to two different filters, and each input port and each output port being connected directly to at least one resonator. The router device is capable of appropriately performing routing in which it is possible to supply on at least one output port an output multiplex having at least a first and a second frequency channel, among which:
  the first frequency channel has originated from a first input multiplex supplied on a first input port and having the said first frequency channel and at least one further frequency channel forwarded to a second output port of the device, and
  the second frequency channel is either forwarded from a second input port, or, when the said first input multiplex comprises at least three different multiplexed frequency channels, the said second frequency channel originates from the said first input multiplex, the said first and second frequency channels, being frequentially disposed on both sides of a third frequency channel, with the said third frequency channel being routed to a different output port.

Advantageously, the multiport router device according to the invention is compact insofar as each input port and each output port is directly connected to at least one resonator, without connection elements such as waveguides or junctions. Thus, the invention makes it possible to obtain an advantage in terms of space requirement and mass as compared to existing solutions, and also to improve the electrical performance by limiting the insertion losses and eliminating the spiking recombination peaks that are typically due to the use of connection elements such as waveguides.

According to one feature, the router device is capable of operating in a reversible manner, the said output ports being used as input ports and said input ports being used as output ports.

Advantageously, the function of filtering and the function of shared output input routing and/or shared input output routing are performed in a single compact multi port router device.

The multi port router device according to the invention may have one or more of the following characteristic features, taken into consideration individually or in combination:
  the said routing is performed by the couplings between resonators of different filters, said couplings being selected in order to perform the routing according to a predetermined routing plan for the routing of P frequency channels obtained on M input ports to N output ports;
  it comprises at least two input ports and at least two output ports;
  at least two frequency channels originating from two different input ports are identical;

each input port is coupled to two resonators via a dual-mode resonant cavity;

it comprises a number of filters equal to the number P of frequency channels;

each filter is composed of a group of the same number of resonators coupled in cascade;

at least one filter includes at least one non resonant node.

BRIEF DESCRIPTION OF THE DRAWINGS

Other characteristic features and advantages of the invention shall become apparent from the description which is provided here below, purely by way of an indication and without any limitation whatsoever, with reference made to the accompanying drawings, amongst which.

DETAILED DESCRIPTION OF PREFERRED EMBODIMENTS

Figure 1:
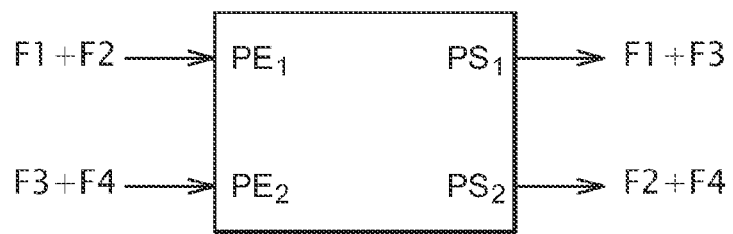
FIG. 1 is a schematic functional illustration of a router device with two input ports and two output ports, and four channels.

FIG. 1 illustrates in a functional manner a multi port router device having two input ports respectively denoted as $PE_1$ and $PE_2$ and two output ports respectively denoted as $PS_1$ and $PS_2$, capable of separating four frequency channels, each frequency channel having an associated carrier respectively denoted as F1, F2, F3 and F4.

In order to simplify the expression each frequency channel shall hereinafter be designated by the associated carrier or carriers.

A first input multiplex, forwarded on to the input port $PE_1$, comprises two carrier frequency channels F1 and F2, and a second input multiplex, forwarded on to the input port $PE_2$, comprises two carrier frequency channels F3 and F4. The channels are respectively separated and recombined. Thus, the frequency channel F1 of the first input multiplex is supplied over the first output multiplex on the output port $PS_1$. The first output multiplex also includes the frequency channel F3 originating from the second input multiplex supplied on the second input port. The second output multiplex supplied on the output port $PS_2$ recombines the frequency channel F2 originating from the first input multiplex supplied on the first input port $PE_1$ and the frequency channel F4 originating from the second input multiplex supplied on the second input port $PE_2$. For example, in one of the possible applications of the invention which is a telecommunications application, the frequency channels have a bandwidth of 33 MHz, the carrier frequencies being included in the frequency band Ku, of 10.7 GHz to 12.75 GHz.

Figure 2:
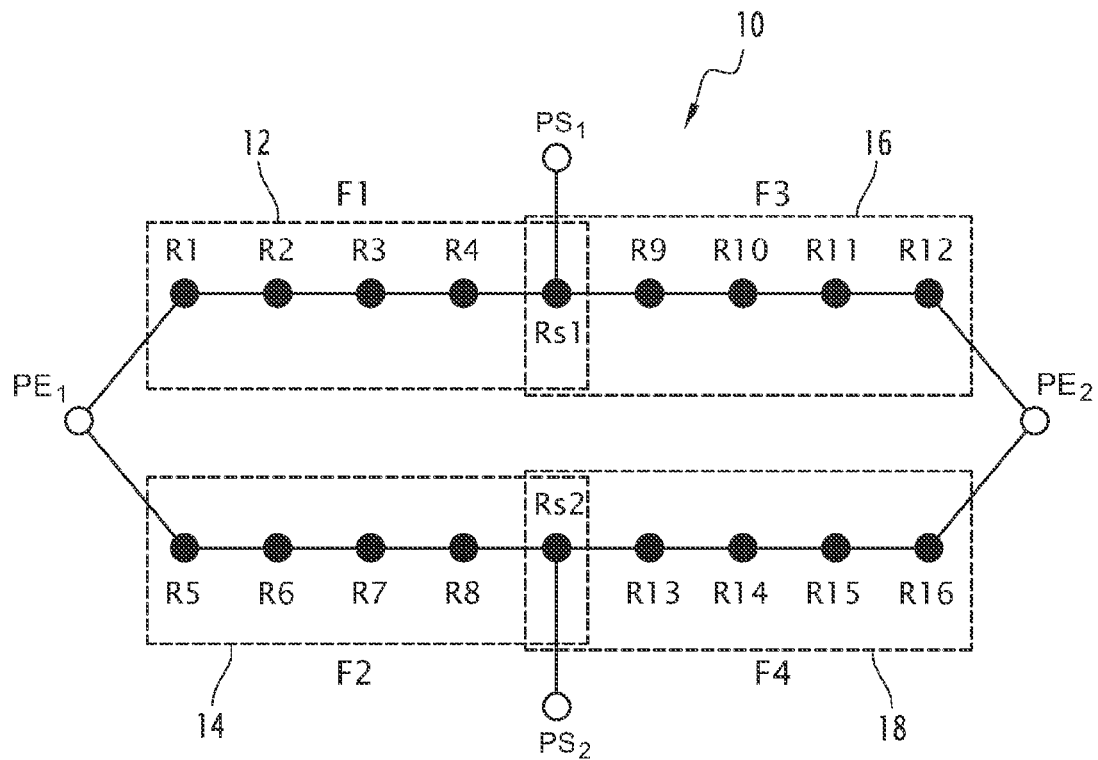
FIG. 2 illustrates schematically an embodiment of the multi port router device in FIG. 1.

A multi port router device 10 according to the invention with two inputs, two outputs and four channels, also called 2×2 router with 4 channels is schematically illustrated in FIG. 2. The router device 10 in this example includes two input ports respectively denoted as $PE_1$ and $PE_2$, and two output ports $PS_1$ and $PS_2$, as in the previous generic example in FIG. 1. Each input multiplex comprises two frequency channels.

The frequency channels are separated by filters 12, 14, 16, 18, each filter being formed by a group of resonators coupled in cascade as illustrated in FIG. 2.

In a more general manner, a filter comprises resonators interconnected with each other, and may also include, by way of a variant, nodes that are non-resonant ("non-resonating nodes") between two resonators.

The input port $PE_1$ is directly coupled to the resonators R1 and R5, the input port $PE_2$ is directly coupled to the resonators R12 and R16. The output port $PS_1$ is coupled to the common resonator Rs1, and the output port $PS_2$ is coupled to the common resonator Rs2.

The filter 12 is a band pass filter tuned to the carrier frequency F1 corresponding to the first input channel of the first input multiplex. This filter includes the resonators denoted as R1, R2, R3, R4 and Rs1, coupled in series.

The filter 14 is a band pass filter tuned to the carrier frequency F2 corresponding to the second input channel of the first input multiplex. This filter includes the resonators denoted as R5, R6, R7, R8 and Rs2, connected in series.

The filter 16 is a band pass filter tuned to the carrier frequency F3 corresponding to the first input channel of the second input multiplex. This filter includes the resonators denoted as R12, R11, R10, R9 and Rs1, coupled in series.

Filter 18 is a band pass filter tuned to the carrier frequency F4 corresponding to the second input channel of the second input multiplex. This filter includes the resonators denoted as R16, R15, R14, R13 and Rs2, coupled in series.

As it may be noted, in the topology example shown in FIG. 2, the resonator Rs1 is electromagnetically coupled to the resonator R4 and participates in the filter 12, but also, in the same way, Rs1 is electromagnetically coupled to the resonator R9 and participates in the filter 16. In a similar manner, the resonator Rs2 is electromagnetically coupled to the resonator R8 and participates in the filter 14, but also, in the same way, Rs2 is electromagnetically coupled to the resonator R13 and participates in the filter 18. Each of the respective resonators Rs1 and Rs2 is common to two different filters.

According to a variant, other couplings between the resonators forming a filter are possible, based on variations of known coupling topology. For example, in the filter 12, the resonators R1 and R4 may also be coupled in order to improve the electrical performance of the system, by the creation of transmission zeros for example.

Figure 3:
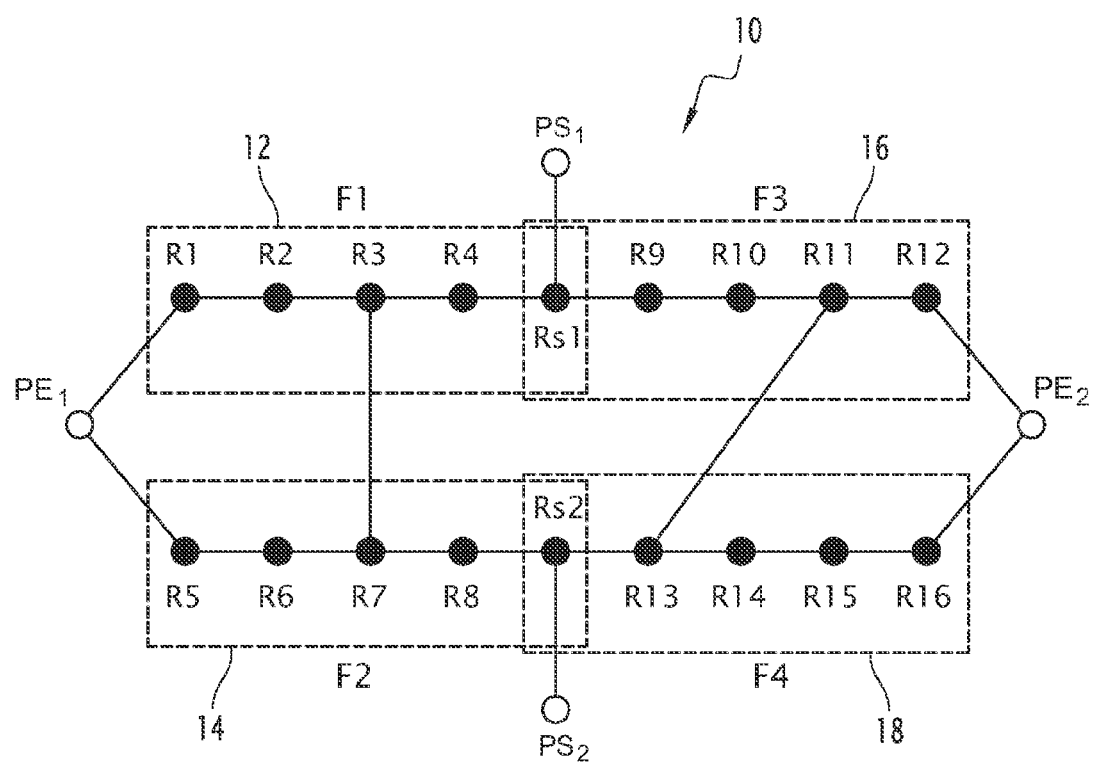
FIG. 3 illustrates a variant of the embodiment in FIG. 2.

FIG. 3 illustrates a variant of the router with two inputs, two outputs, and four channels as in FIG. 2. In this variant, the resonators R3 and R7 and the filters F1 and F2 are also coupled with each other. In addition, the resonators R11 and R13 and the respective filters F3 and F4 are also coupled with each other.

It is to be understood that, other connection topologies (not shown) may also be considered. For example, all the resonators could be common to the filters, with vertical or diagonal connections between resonators.

The couplings between the resonators are selected in order to perform the routing in accordance with a predetermined routing plan for routing P frequency channels obtained on M input ports to N output ports.

Figure 4:
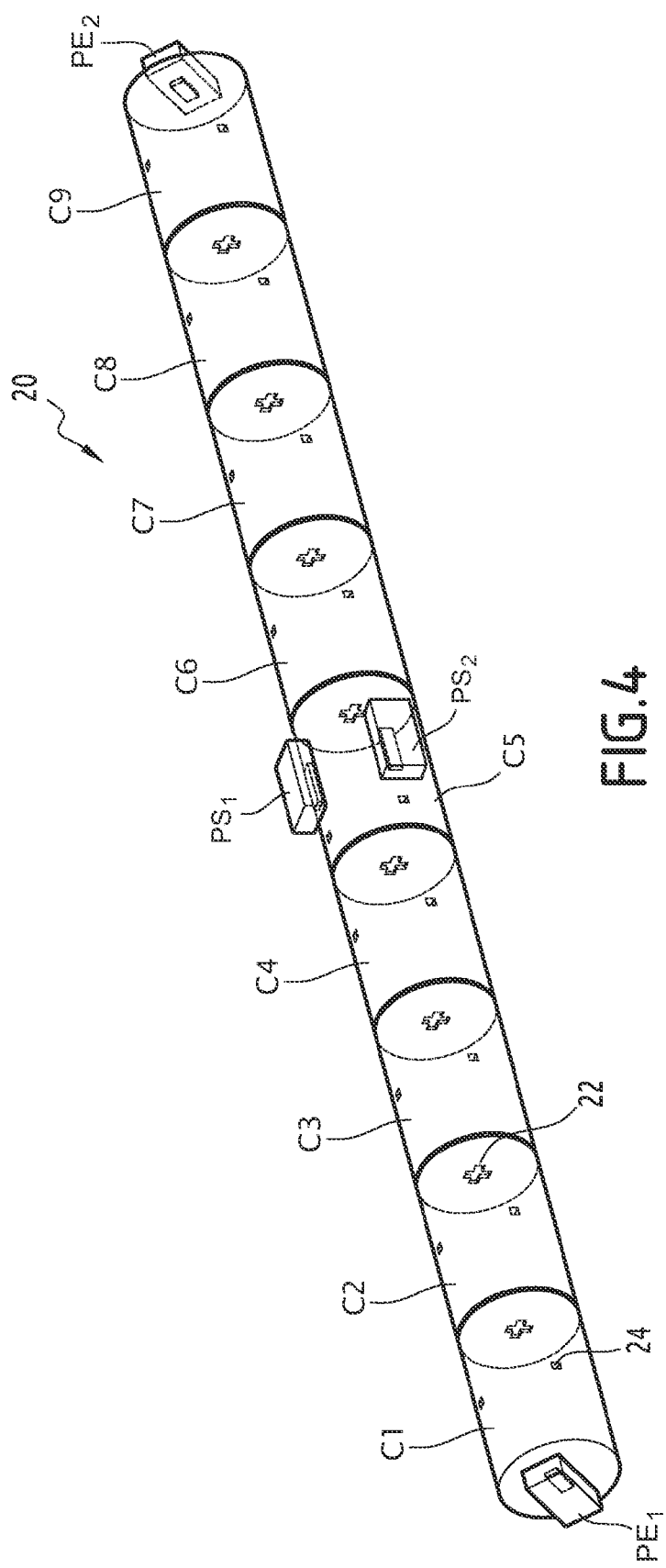
FIG. 4 illustrates an embodiment of the compact multi port router device in FIG. 2 having dual-mode cavities.

According to the embodiment illustrated in FIG. 4, the multi port router device is built by means of a device 20 with dual-mode cavities. The device 20 comprises of nine dual-mode cavities, respectively denoted as C1 to C9. Each cavity comprises of a pair of resonators, which based on different modes of resonance, are polarised at 90° from each other; respectively the cavity C1 includes the resonators R1 and R5, and the cavity C2 includes the resonators R2 and R6, and so on.

Adjacent cavities are coupled by irises 22 in this embodiment. In addition, coupling and tuning screws 24 are also used to tune the resonance frequencies and to couple the polarisations between one another.

The cavity denoted as C5 includes two resonators Rs1 and Rs2 to which are coupled the output ports $PS_1$ and $PS_2$. As illustrated in FIG. 4, the output ports $PS_1$ and $PS_2$ are arranged at the periphery of the cavity C5 in positions that are angularly different.

The filters 12 and 14 have been developed as dual-band filters by means of the cavities C1 to C5 and the filters 16 and 18 have been developed as dual-band filters by means of the cavities C5 to C9.

According to one embodiment, which is called co-frequency embodiment, the carrier frequencies F1 and F4 and/or the carrier frequencies F2 and F3 are identical (principle of frequency reuse for satellite communications applications). Advantageously, it is possible to perform the routing function for applications using the same frequency channels to transmit various different data.

A multi port router device as described with reference to FIG. 2 is characterised by a normalised coupling matrix obtained in a prior phase of synthesis which makes it possible to define the optimal architecture that implements the selected routing plan. A coupling matrix is a matrix that represents the electromagnetic coupling for each pair of elements of the router device (denoted as $M_{ij}$), the resonance frequency for each resonator participating in the filtering function (represented by the term $M_{ii}$) and the electromagnetic coupling at the input and output on each of the ports with the resonator or resonators brought into play (denoted as $R_{in}$ and $R_{out}$, respectively input and output resistances). In an exemplary embodiment illustrated in detail here below, the coupling matrix is a symmetrical square matrix, and all of the coupling values are 0 except for the following coupling values, where C(Ei, Ej) represents the coupling value between the elements Ei and Ej:

C($PE_1$, R1)=1.010; C($PE_1$, R5)=1.010;
C($PE_2$, R12)=1.010; C($PE_2$, R16)=1.010;
C(R1, R1)=−3.838; C(R1,R2)=0.759;
C(R2,R2)=−3.460; C(R2,R3)=0.636;
C(R3,R3)=−3.215; C(R3,R4)=1.017;
C(R4,R4)=−1.678; C(R4,Rs1)=2.360;
C(R5,R5)=−0.753; C(R5,R6)=0.747;
C(R6,R6)=−1.121; C(R6,R7)=0.581;
C(R7,R7)=−1.182; C(R7,R8)=0.594;
C(R8,R8)=−1.167; C(R8,Rs2)=1.137
C(Rs1, Rs1)=−1.140; C(Rs1,R9)=1.133; C(Rs1, $PS_1$)=1.383;
C(Rs2, Rs2)=1.079; C(Rs2, R13)=2.349; C(Rs2, $PE_2$)=1.383;
C(R9,R9)=1.162; C(R9,R10)=0.592;
C(R10,R10)=1.178; C(R10,R11)=0.580;
C(R11,R11)=1.117; C(R11,R12)=0.745;
C(R12, R12)=0.750;
C(R13,R13)=1.667; C(R13,R14)=0.999;
C(R14,R14)=3.216; C(R14,R15)=0.629;
C(R15, R15)=3.446; C(R15,R16)=0.751;
C(R16,R16)=3.834;

The values provided are normalised relative to a frequency $f_0$ such that $$f_i = f_0 \sqrt{\frac{\frac{f_0}{\Delta f} + \frac{M_{ii}}{2}}{\frac{f_0}{\Delta f} - \frac{M_{ii}}{2}}}$$

with $f_0$ being the central frequency of the channel, $f_i$ the resonance frequency of the resonator i considered, $M_{ii}$ the normalised parameter of the coupling matrix relative to the resonance frequency of the resonator i, and $\Delta f$ the equiripple bandwidth of the channel considered.

The input/output resistances $R_{in}$ and $R_{out}$ depend on the excitation systems and are therefore directly related to a parameter called external quality factor $Q_{ext}$ by the relationship:

$$R = \frac{f_0}{\Delta f_{-3dB} \times Q_{ext}}$$

The terms $M_{ij}$, have also been normalised and express the different couplings between the resonance elements and are linked to the coupling coefficients $k_{ij}$ by the following formula:

$$k_{ij} = \frac{\Delta f_{équiond.}}{f_0} \times M_{ij}$$

These coefficients represent the intensity of the interaction between two resonances.

The respective carrier frequencies are as follows in this example: F1=11.843 GHz, F2=11.881 GHz, F3=11.919 GHz and F4=11.957 GHz.

Figure 5:
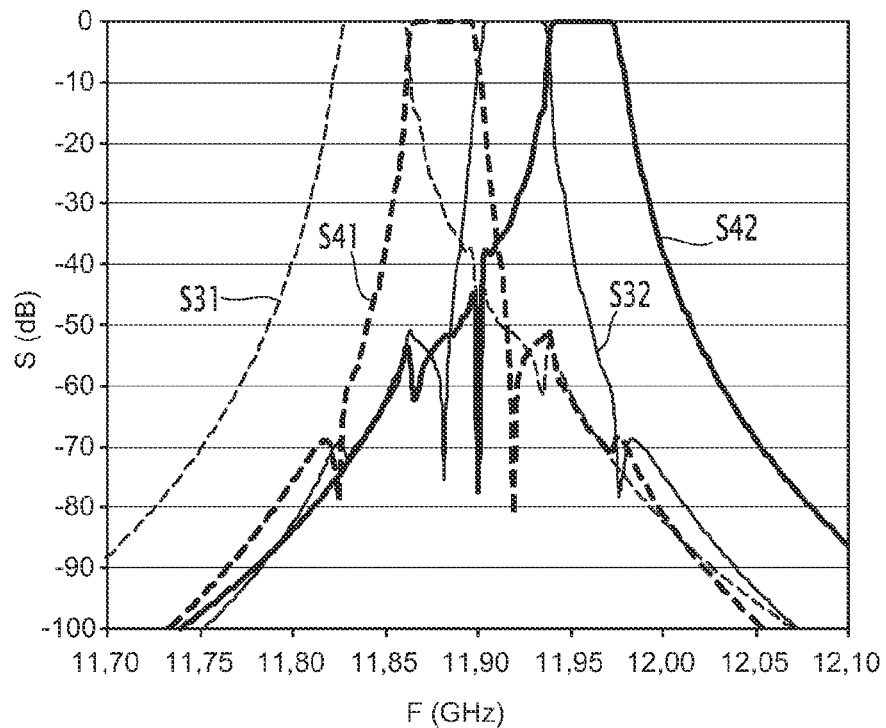
FIG. 5 is a graph illustrating the transmission responses for an example of the embodiment in FIG. 4.

FIG. 5 illustrates, in this embodiment and for the coupling matrix whose values have been described here above as an example, the transmission losses between the various ports, expressed in Decibels (dB) depending on the frequency expressed in GHz.

Figure 6:
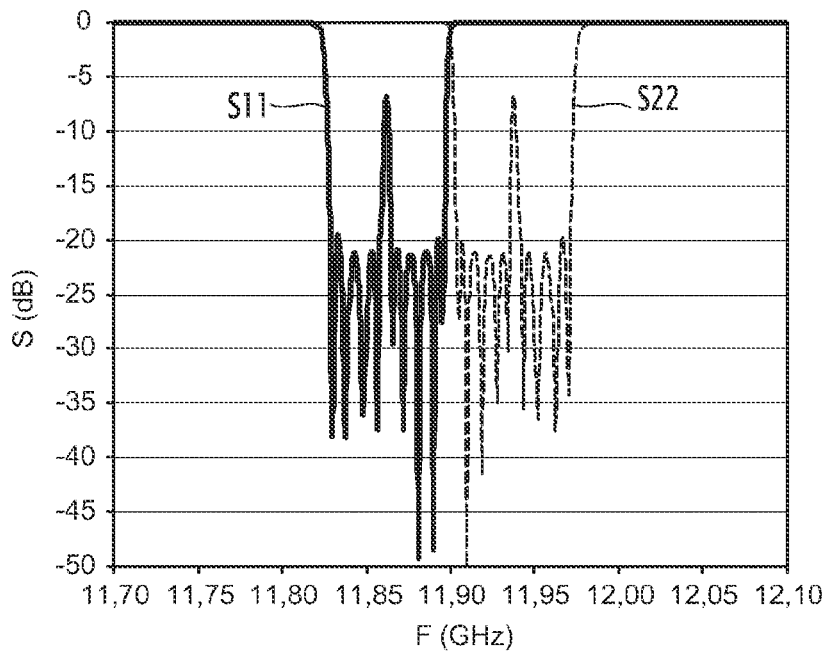
FIGS. 6 and 7 are graphs of the reflection responses for an example of the embodiment in FIG. 4.
Figure 7:
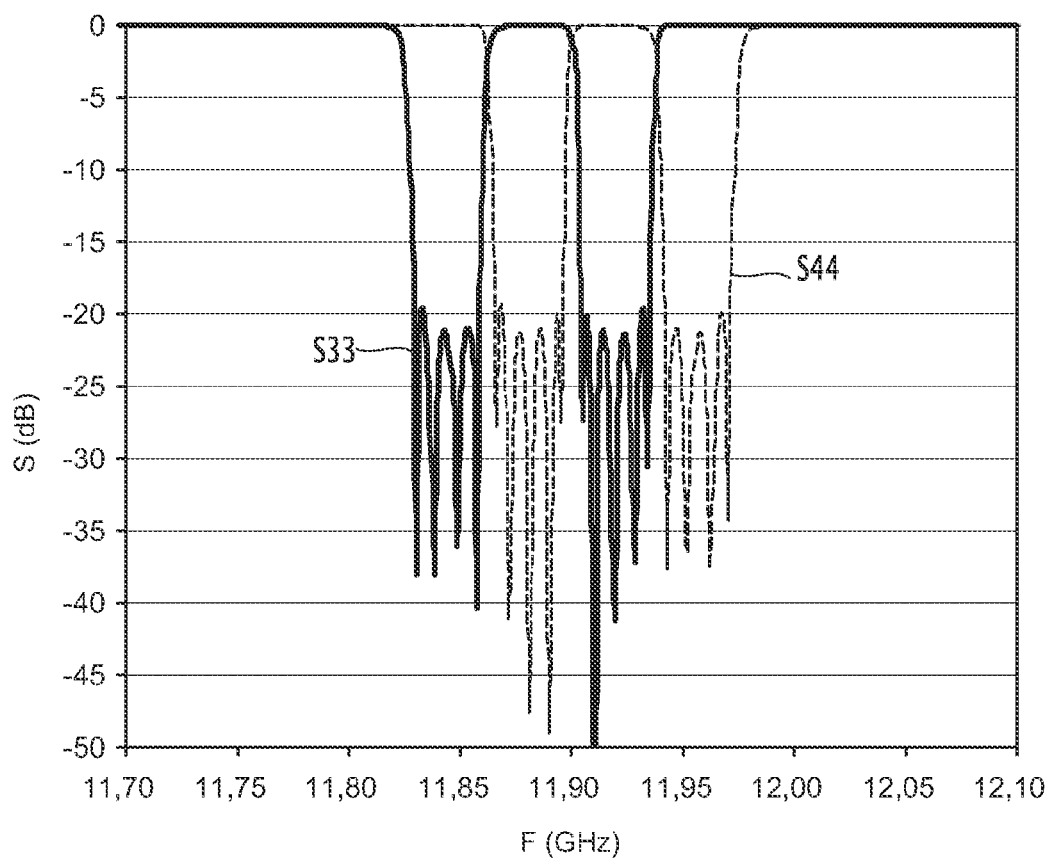

FIGS. 6 and 7 illustrate the reflection responses for each of the ports.

Figure 8:
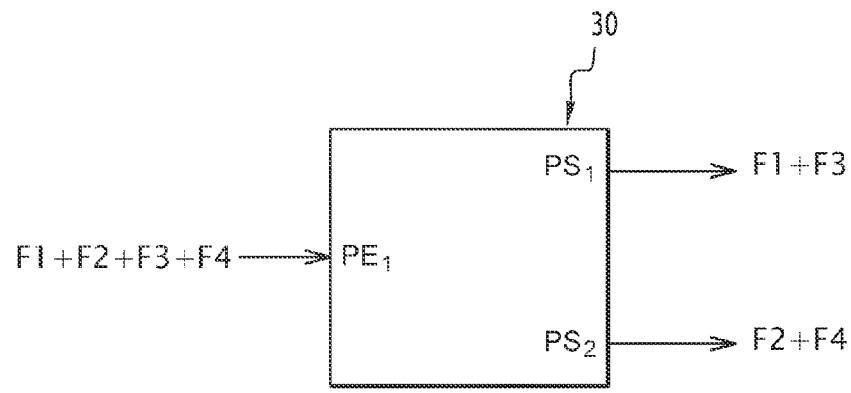
FIG. 8 functionally illustrates a multi port router device with one input, two outputs, four channels.

FIG. 8 functionally illustrates a multi port router device 30 which has one single input port and two output ports, so M=1 and N=2, and the number of channels to be separated and recombined is P=4 (1×2 router, 4 channels). In a more general manner, there is a shared input output routing when the number of input channels of different carrier frequencies to be separated and recombined is greater than or equal to 3, in the event of the router device having one input port and two output ports.

In this particular case functionally illustrated in FIG. 8, an input multiplex carrying the channels F1+F2+F3+F4, the respective carrier frequencies F1, F2, F3 and F4 being different, is routed to two output ports $PS_1$ and $PS_2$, with a recombination of the non adjacent frequency channels: the first output multiplex, forwarded on to the port $PS_1$, is composed of the frequency channels F1+F3, and the second output multiplex, forwarded on to the port $PS_2$ is composed of the frequency channels F2+F4. It is to be emphasised that it indeed involves execution of the function of shared input output routing in this example, and not a simple multiplexing function to the extent where the output frequency channels are separated and recombined, the recombination consisting of recombining into one output multiplex at least two channels (for example F1 and F3) which are frequentially situated on both sides of a channel (for example F2) which is forwarded on to another output port (port $PS_2$ in this example).

Figure 9:
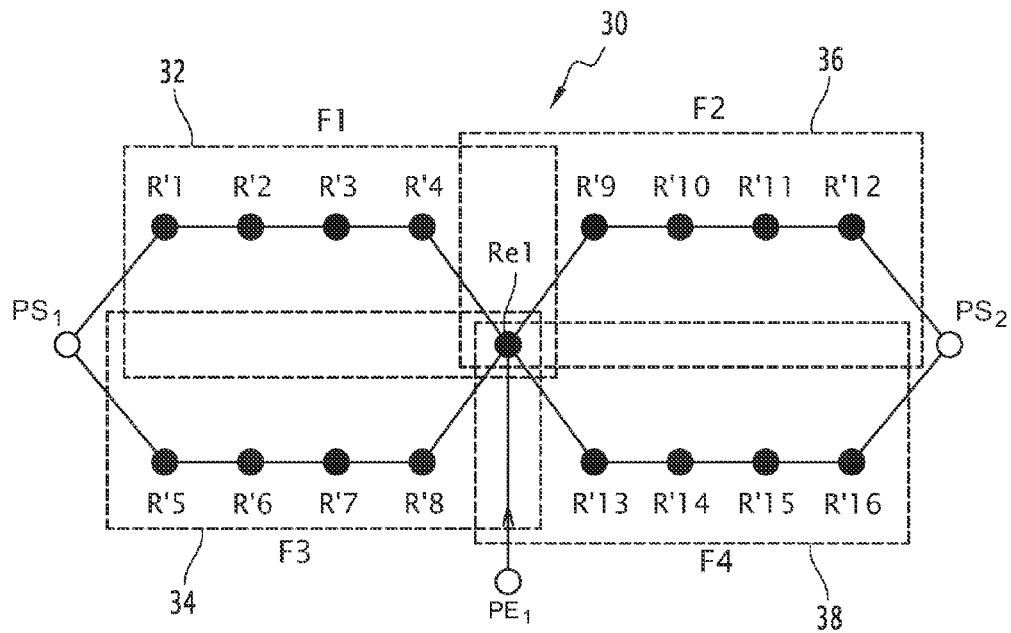
FIG. 9 schematically illustrates an embodiment of the multi port router device in FIG. 8.

According to an embodiment shown in FIG. 9, the router device with one input port and two output ports is developed with the use of four filters 32, 34, 36 and 38, each consisting of four coupled resonators. The input port $PE_1$ is directly connected to a resonator Re1, which is for example of the cavity type, like in the implementation example in FIG. 4. The resonator Re1 is coupled to the respective resonators R'4, R'8, R'9 and R'13, forming part of the filters of the respective carrier frequency channels F1, F2, F3 and F4.

Figure 10:
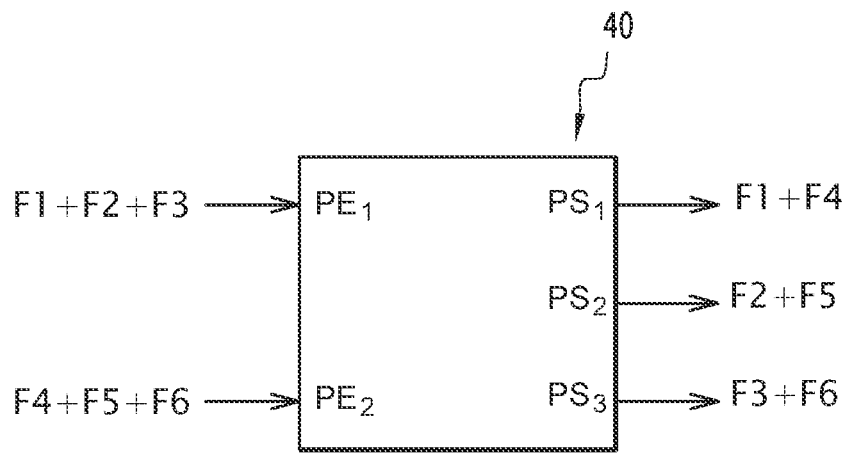
FIG. 10 functionally illustrates a multi port router device with two inputs, three outputs, six channels.
Figure 11:
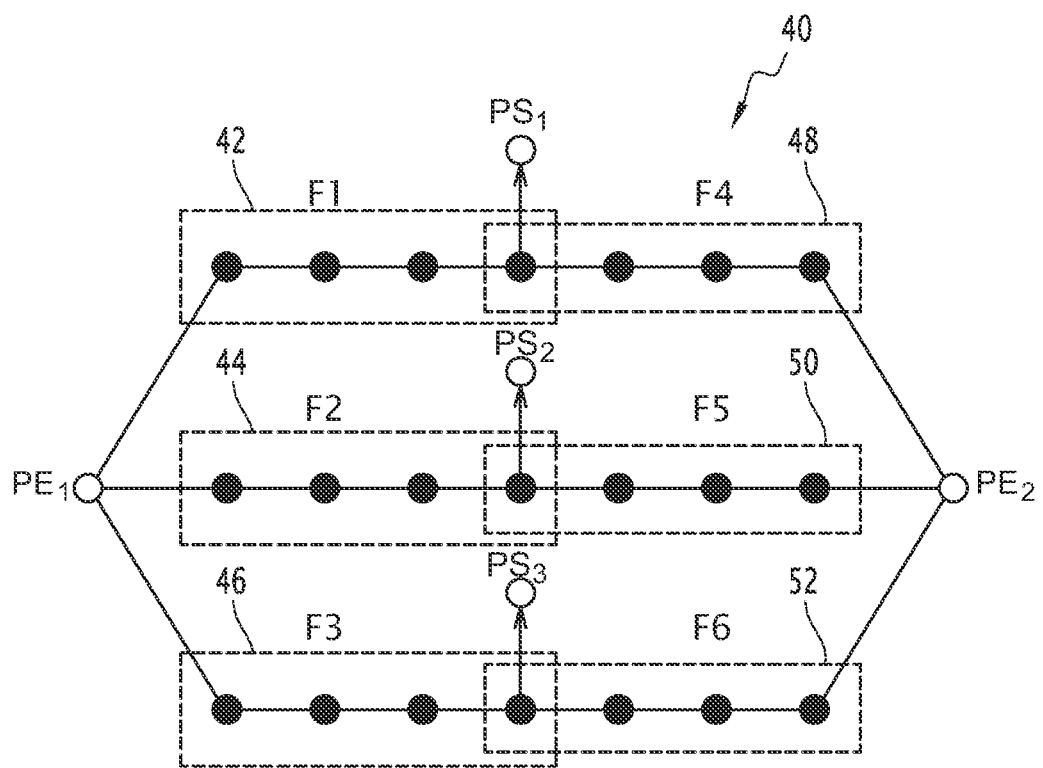
FIG. 11 schematically illustrates an embodiment of the multi port router device in FIG. 10.

A third example of a multi port router device according to the invention is illustrated in FIGS. 10 and 11. In this example, the router device 40 is a 2×3 router, with 6 channels having two input ports (M=2) denoted respectively as $PE_1$ and $PE_2$ and three output ports (N=3), denoted as $PS_1$, $PS_2$ and $PS_3$. A number P=6 of frequency channels is routed: each input multiplex is a multiplex with three frequency channels, and each output multiplex is a multiplex with two frequency channels. The frequency channels are separated and recombined according to the routing plan shown in FIG. 10. As illustrated in FIG. 11, according to an embodiment for the routing function illustrated in FIG. 10, each respective input port is directly coupled to three resonators, and each output port is directly coupled to one single resonator. Thus, according to one embodiment of the invention, generalised to any number of input and output ports, each port may be coupled to as many resonators as the number of frequency channels forwarded on to this port.

In the example in FIG. 11, each respective filter 42, 44, 46, 48, 50 and 52, is formed by a group of four resonators coupled in series. However, the number of resonators in series may, in a variant, vary from one filter to another.

A multi port resonator device 40 may for example be built with the technology of coupled tri-mode cavities.

Figure 12:
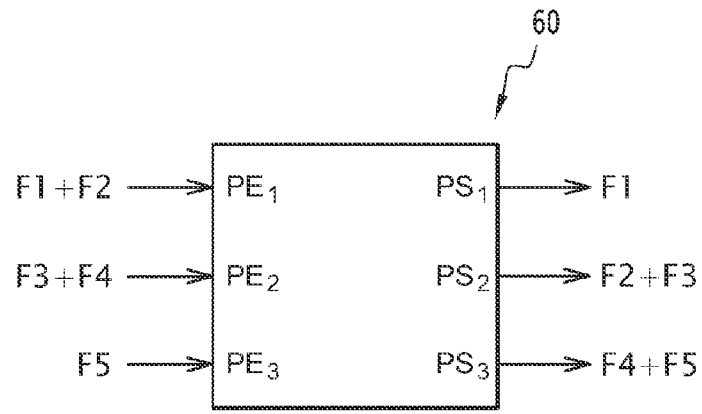
FIG. 12 functionally illustrates a multi port router device with three inputs, three outputs, five channels, and FIG. 13 schematically illustrates an embodiment of the multi port router device in FIG. 12.
Figure 13:
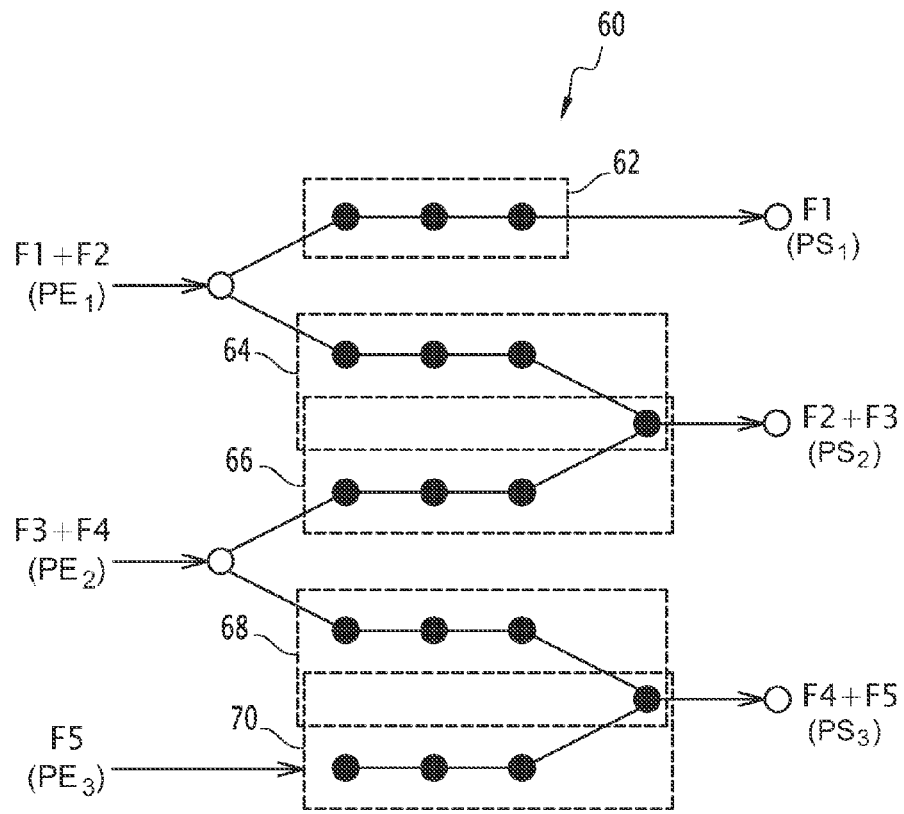

A fourth routing function of a compact multi port router device according to the invention is illustrated in FIGS. 12 and 13. The router device 60 is a 3×3 router, with 5 channels, which thus comprises M=3 input ports, N=3 output ports, and is capable of carrying P=5 frequency channels. According to the routing plan illustrated in FIG. 12, the first two-channel time multiplex is forwarded on to the input port $PE_1$, a second two-channel time multiplex is forwarded on to the input port $PE_2$ and one single frequency channel is sent to the input port $PE_3$. The output ports are denoted as $PS_1$, $PS_2$ and $PS_3$, and only the frequency channel of the carrier frequency F1 is forwarded on to $PS_1$, whereas the other frequency channels are recombined on to the multiplexes with two frequency channels on the respective ports $PS_2$ and $PS_3$.

An embodiment of the routing function with coupled resonators is illustrated in FIG. 13. The router device 60 includes five filters denoted respectively as 62, 64, 66, 68 and 70, formed of resonators coupled in series. The filters 64, 66 each comprise four resonators, the resonator coupled to the output port $PS_2$ being common to both filters. In a similar manner, the filters 68, 70 each have four resonators, including a common resonator coupled to the output port $PS_3$.

The input ports $PE_1$ and $PE_2$ are each coupled to two resonators belonging to two different filters, respectively the filters 62 and 64 for the input port $PE_1$ and the filters 66 and 68 to the input port $PE_2$. The input port $PE_3$ is directly coupled to a single resonator of the filter 70. At the output, the ports $PS_2$ and $PS_3$ are each coupled to a common resonator of two different filters, while the output port $PS_1$ is coupled to a single resonator of the filter 62.

It is to be noted that the multi port router devices according to the invention are reversible, and thus usable with the output ports being used as input ports and the input ports being used as output ports.

The examples provided here above have been described with an embodiment of the resonators making up the multi port router devices with dual-mode or tri-mode cavities. Alternatively, other known technologies for building resonators may be considered, as well as other modes of coupling.

According to alternative embodiments, parallel couplings between different resonators participating in different filters may be added in order to execute the routing functions according to a predetermined routing plan.

Advantageously, the invention makes it possible to develop compact multi port router devices, without the need for additional junction elements, while also improving the electrical performance in comparison with existing router devices, through the reduction of insertion losses and elimination of spiking recombination peaks.

The invention claimed is:

1. A multi port router device capable of carrying a number P, which is greater than or equal to three, of frequency channels, from a number M of input ports to a number N of output ports, at least one of the two numbers M and N being greater than or equal to two, it including at least two filters, each of the filters comprising at least two coupled resonators, at least one of the resonators (Rs1, Rs2, Re1) being common to the at least two filters, and each of the input ports and each of the output ports being connected directly to at least one of the resonators, the router device is capable of appropriately performing routing in which it is possible to supply on at least one of the output ports an output multiplex having at least a first and a second frequency channel of the P frequency channels, among which the first frequency channel has originated from a first input multiplex, supplied on a first one of the input ports and comprising said first frequency channel and at least one further frequency channel of the P frequency channels, the at least one further frequency channel forwarded to a second one of the output ports of the device, and the second frequency channel is either forwarded from a second one of the input ports, or, when the first input multiplex comprises at least three different multiplexed frequency channels of the P frequency channels, the second frequency channel originates from the first input multiplex, the first and second frequency channels, being frequentially disposed on both sides of a third frequency channel of the P frequency channels, with the third frequency channel being routed to a different one of the output ports.

2. A multi port router device according to claim 1, being capable of operating in a reversible manner, the output ports being used as the input ports and said input ports being used as the output ports.

3. A multi port router device according to claim 1 wherein said routing is performed by couplings between resonators of different ones of the filters, said couplings being selected in order to perform the routing according to a predetermined routing plan for the routing of the P frequency channels obtained on the M input ports to N output ports.

4. A multi port router device according to claim 1, wherein the M input port comprises at least two input ports and the N output ports comprises at least two output ports.

5. A multi port router device according to claim 4, wherein at least two of the frequency channels originating from two different ones of the input ports are identical.

6. A multi port router device according to claim 4, wherein each of the input port is coupled to two of the resonators via a dual-mode resonant cavity.

7. A multi port router device according to claim 1, comprising a number of the filters equal to the number P of frequency channels.

8. A multi port router device according to claim 7, wherein each of the filters are composed of a group of the same number of resonators coupled in cascade.

9. A multi port router device according to one claim 1, wherein at least one of the filters includes at least one non resonating node.

* * * * *